United States Patent
Hutchins et al.

(10) Patent No.: US 8,019,034 B2
(45) Date of Patent: Sep. 13, 2011

(54) COMMON STATE-SPACE MULTI-CHANNEL DIGITAL SAMPLE TIMING PHASE CONTROL OF MULTIPLE READ CHANNELS FOR CORRELATED SIGNALS

(75) Inventors: Robert Allen Hutchins, Tucson, AZ (US); Jens Jelitto, Rueschlikon (CH); Sedat Oelcer, Kilchberg (CH)

(73) Assignee: International Business Machines Corporation, Armonk, NY (US)

( * ) Notice: Subject to any disclaimer, the term of this patent is extended or adjusted under 35 U.S.C. 154(b) by 950 days.

(21) Appl. No.: 11/870,765

(22) Filed: Oct. 11, 2007

(65) Prior Publication Data
US 2009/0097603 A1    Apr. 16, 2009

(51) Int. Cl.
*H04L 7/00* (2006.01)
(52) U.S. Cl. ........ 375/371; 375/354; 375/375; 375/376; 455/260; 455/502; 455/516; 327/141; 327/147; 327/156
(58) Field of Classification Search .................. 375/354, 375/371, 375, 376; 455/502, 516, 260; 327/141, 327/147, 156
See application file for complete search history.

(56) References Cited

U.S. PATENT DOCUMENTS

| | | | |
|---|---|---|---|
| 5,986,834 A | 11/1999 | Colineau et al. | |
| 6,549,561 B2* | 4/2003 | Crawford | 375/137 |
| 7,110,485 B2* | 9/2006 | Bertschmann et al. | 375/375 |
| 7,245,677 B1* | 7/2007 | Pare, Jr. | 375/344 |
| 7,274,762 B2* | 9/2007 | Schenk et al. | 375/355 |
| 7,433,142 B2* | 10/2008 | Bui et al. | 360/46 |
| 2005/0144534 A1* | 6/2005 | Hutchins et al. | 714/45 |
| 2009/0257540 A1* | 10/2009 | Tan | 375/371 |

FOREIGN PATENT DOCUMENTS

| | | |
|---|---|---|
| EP | 0901126 | 3/1999 |
| EP | 1404051 | 3/2004 |

* cited by examiner

*Primary Examiner* — Leon Flores
(74) *Attorney, Agent, or Firm* — John H. Holcombe

(57) ABSTRACT

Common sample timing control for sample timing of multiple read channels, wherein the signal clocking of the signals received by the multiple read channels are correlated, for example from parallel tracks of magnetic tape that have been written simultaneously. In one embodiment, a common sample timing control comprises multiple phase error inputs, each indicating phase error of one of the read channels. Logic responsive to the multiple phase error inputs is configured to weight and crosscouple the phase error indication of each phase error input with the phase error indication of each other phase error input, and to apply gain related to the variance of noise of the phase error indications. Feedback logic is responsive to the crosscoupling and is configured to provide a sample timing phase estimate for each read channel.

20 Claims, 4 Drawing Sheets

COMMON STATE-SPACE MULTI-CHANNEL DIGITAL SAMPLE TIMING PHASE CONTROL OF MULTIPLE READ CHANNELS FOR CORRELATED SIGNALS

DOCUMENT INCORPORATED BY REFERENCE

Commonly assigned U.S. Pat. No. 5,442,315 is incorporated for its showing of phase locked loops used in data detection.

FIELD OF THE INVENTION

This invention relates to multi-channel data detection, and, more particularly, to sample timing of multiple read channels, wherein the signal clocking of the signals received by the multiple read channels are correlated.

BACKGROUND OF THE INVENTION

Data storage having multiple channels typically employs movable media in which data is recorded on one pass of the media, and the data is read back and detected at a subsequent time, possibly on a different pass of the media and possibly on a different drive than that which recorded the data. One example of movable media is magnetic tape which has a plurality of parallel tracks for recording. The parallel tracks are typically written simultaneously such that the signal clocking of the signals written on parallel media are correlated.

Symbol timing recovery during readback represents one of the most critical functions in data storage read channels. Sampling an analog readback signal at the right time instant is important for achieving good overall performance. Among the challenges presented are the presence of disturbances such as dropout events, instantaneous speed variations, and signal distortion of various origins, which make timing recovery difficult. As areal recording densities become higher and higher, SNR (signal to noise ratio) margins are decreased, making satisfactory timing recovery an even more challenging task.

Timing recovery typically is based on a PLL (phase locked loop) for each channel whose purpose is to accurately estimate the timing offsets before sampling the analog signal. Problems in this context, especially with degraded channel conditions as explained above, are those of temporary "loss of lock" or "cycle slip". These terms refer to a phenomenon where the phase adjustments of the timing control loop stabilize around an undesirable phase value that is located one or several symbol interval durations apart from the desired operating point. This phenomenon often results in long bursts of bit and symbol errors which may exceed the error correction capability of the error correction codes, such as Reed-Solomon codes, leading to severe performance degradation or even permanent error situations.

The conventional approaches have been to optimize the operation of the PLL for maximum noise rejection and loop jitter minimization, to increase the loop robustness by using more reliable decisions, etc.

The incorporated '315 patent, inter alia, takes advantage of the multiple channels by providing a global clock which generates a global average frequency signal by averaging the content of the frequency registers employed by the PLLs of the individual channels. The global average frequency is employed by the PLL of each track which adds its own scaled phase error to it.

SUMMARY OF THE INVENTION

Common sample timing control for and methods related to sample timing of multiple read channels, wherein the signal clocking of the signals received by the multiple read channels are correlated.

In one embodiment, a common sample timing control comprises multiple phase error inputs, each indicating phase error of one of the read channels. Logic responsive to the multiple phase error inputs is configured to weight and crosscouple the phase error indication of each phase error input with the phase error indication of each other phase error input, and to apply common gain. Feedback logic is responsive to the crosscoupling and is configured to provide a sample timing phase estimate for each read channel.

In a further embodiment, the weighting and crosscoupling are applied with respect to the integral of the phase error indication of each phase error input.

In another embodiment, the weight for each phase error input is related to the noise variance associated with the phase error indications for the phase error input being weighted.

In a further embodiment, the weight for each phase error input is determined in accordance with the formula:

$$w_k^{(i)} = \sqrt{\rho_k^{(i)} \Big/ \sum_{n=1}^{N} \rho_k^{(n)}}$$

where $w_k^{(i)}$ is the weight for channel i at time k, and where $\rho_k^{(i)}$ is the inverse of the estimate of the noise variance associated with the phase error indications for channel i at time k, and where N is the total number of channels.

In another embodiment, the weight for each phase error input is determined in accordance with the formula:

$$w_k^{(i)} = \rho_k^{(i)} \Big/ \sum_{n=1}^{N} \rho_k^{(n)}$$

where $w_k^{(i)}$ is the weight for channel i at time k, and where $\rho_k^{(i)}$ is the inverse of the estimate of the noise variance associated with the phase error indications for channel i at time k, and where N is the total number of channels.

In a further embodiment, the weighting and applied gain are determined in accordance with the formula:

$$\beta_k^{(i)} = w_k^{(i)} \sqrt{\zeta},$$

where $\beta_k^{(i)}$ is the gain for channel i at time k, where $w_k^{(i)}$ is the weight for channel i at time k, and where $\sqrt{\zeta}$ is a common gain and is related to the ratio of the noise variance that characterizes the frequency error variations to the noise variance that characterizes the phase error indications for all channels.

In another embodiment, a read detection signal clocking system for a magnetic tape drive comprises multiple phase inputs, each indicating the phase of a sample taken with respect to one of a plurality of read channels of the magnetic tape drive, the read channels configured to provide samples of data from magnetic tape read by the magnetic tape drive; phase error logic responsive to each of the multiple phase inputs configured to determine phase error of the sample of one of the read channels and provide a phase error indication at a phase error input with respect to each of the plurality of read channels; logic responsive to the phase error inputs configured to weight and crosscouple the phase error indication of each phase error input with the phase error indication of each other phase error input, and to apply common gain; and feedback logic responsive to the crosscoupling configured to provide a sample timing phase estimate for each read channel.

In still another embodiment, a common state-space multi-channel digital sample timing phase control of multiple read channels for correlated signals, the signals correlated with respect to the timing of the signals, comprises multiple phase inputs, each indicating the phase of at least one digital sample taken with respect to one of a plurality of read channels at a current state, the read channels configured to provide digital samples of the correlated signals. Phase error logic responsive to each of the multiple phase inputs is configured to determine phase error of the sample of one of the read channels at the current state and provide a phase error indication at a phase error input with respect to each of the plurality of read channels. Logic responsive to the phase error inputs is configured to weight and crosscouple the phase error indication of each phase error input with the phase error indication of each other phase error input, and to apply common gain; and feedback logic responsive to the crosscoupling and configured to provide a sample timing phase estimate for the next state of each read channel.

For a fuller understanding of the present invention, reference should be made to the following detailed description taken in conjunction with the accompanying drawings.

DETAILED DESCRIPTION OF THE INVENTION

This invention is described in preferred embodiments in the following description with reference to the Figures, in which like numbers represent the same or similar elements. While this invention is described in terms of the best mode for achieving this invention's objectives, it will be appreciated by those skilled in the art that variations may be accomplished in view of these teachings without deviating from the spirit or scope of the invention.

Figure 1:
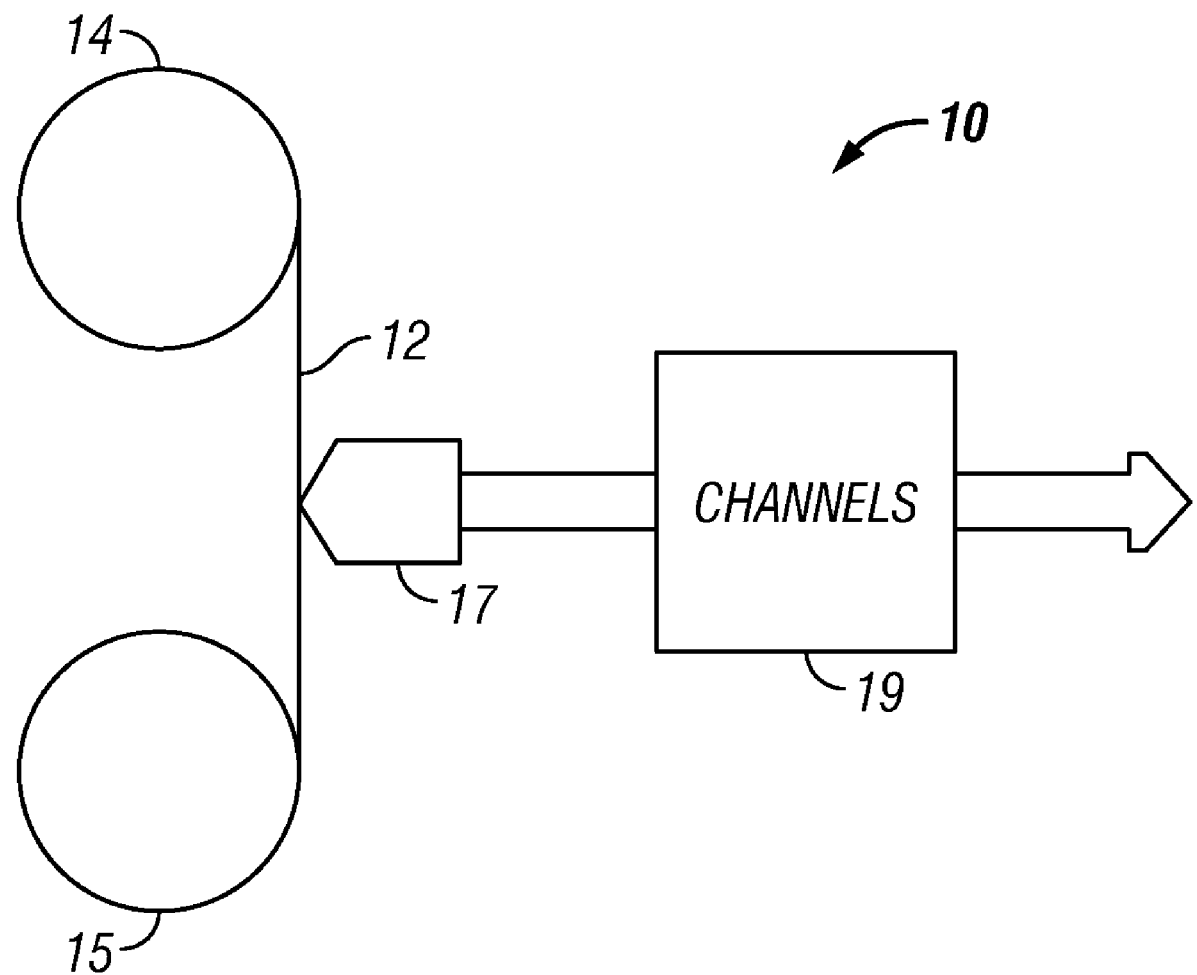
FIG. 1 is a block diagrammatic illustration of a multi-channel detection system which incorporates common sample timing control for and methods related to sample timing of multiple read channels in accordance with the present invention.

Referring to FIG. 1, a multi-channel detection system 10 is illustrated for data storage which, for example employs movable media 12 in which data is recorded on one pass of the media, and the data is read back and detected at a subsequent time, possibly on a different pass of the media, and possibly on a different drive than that which recorded the data. One example of movable media 12 is magnetic tape which has a plurality of parallel tracks for recording and which is wound on reels 14 and 15, for example of a data storage cartridge and/or a data storage drive. A multi-track head 17 reads back the recorded contents of the movable media and supplies the readback signals to multiple channels 19, which detect the data from the readback signals.

Figure 2:
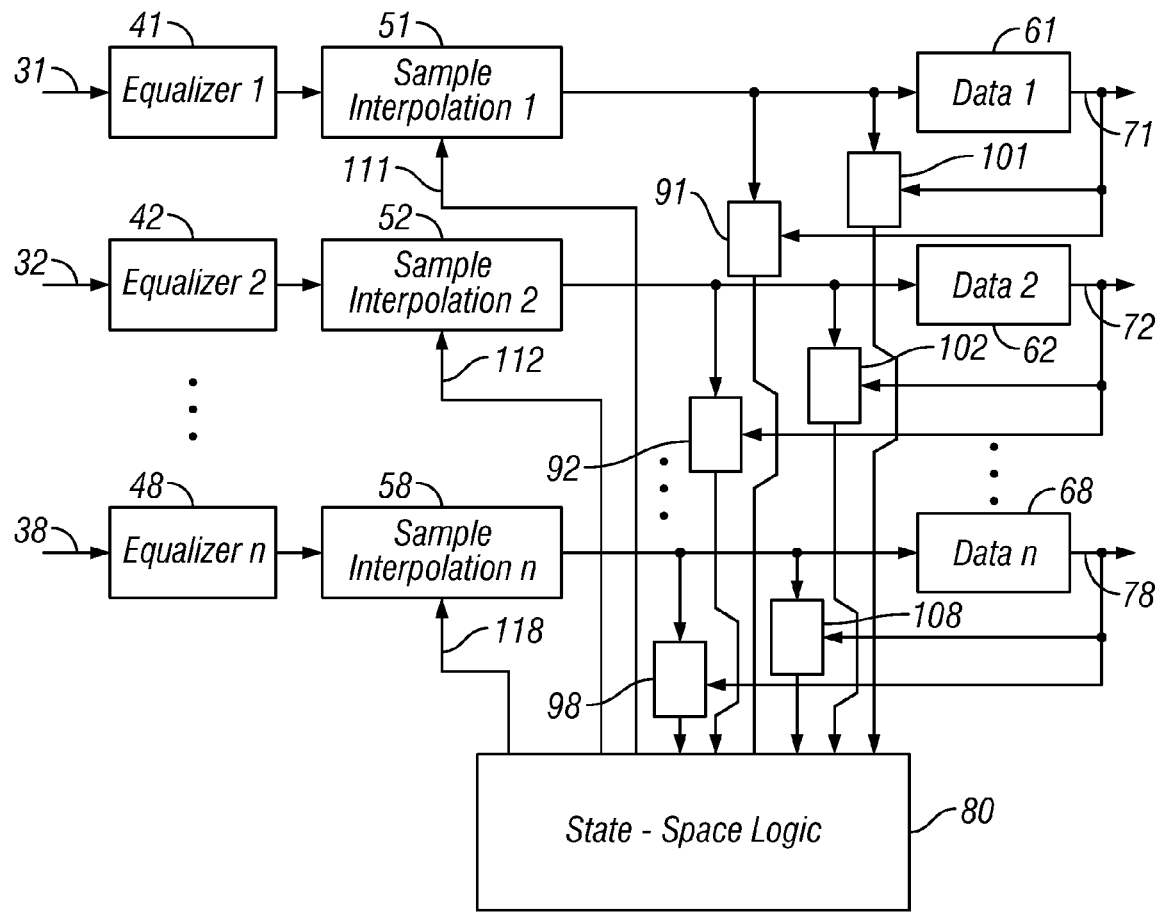
FIG. 2 is a block diagrammatic illustration of a sample timing control for multiple read channels of FIG. 1.

Referring to FIG. 2, symbol timing recovery of the readback signals represents one of the most critical functions in data detection read channels. Sampling an analog readback signal at the right time instant is important for achieving good overall performance. Among the challenges presented for timing recovery are the presence of disturbances such as dropout events, instantaneous speed variations, and signal distortion of various origins. As areal recording densities become higher and higher, SNR (signal to noise ratio) margins are decreased, making satisfactory timing recovery an even more challenging task.

Timing recovery typically is based on a PLL (phase locked loop) for each channel whose purpose is to accurately estimate the timing offsets before sampling the analog signal. Many versions of PLLs exist, including the PLLs discussed in the incorporated U.S. Pat. No. 5,442,315.

FIG. 2 illustrates an embodiment of the multi-channel detection system of FIG. 1 that incorporates a common sample timing control in accordance with the present invention.

The output signal for each of the channels from the head 17 of FIG. 1 is converted from analog to digital, for example by an ADC (analog to digital converter), and the stream of digital signals for each channel is provided at one of the inputs 31, 32 . . . 38 in FIG. 2. In this architecture, the stream of digital signals has not yet been adjusted in phase or frequency because the ADC is clocked by a free running clock. Such an architecture avoids the need for a voltage controlled oscillator circuit per channel, which may represent an implementation advantage in multichannel systems. An equalizer 41, 42 . . . 48 may adjust the signals to compensate, e.g., for the characteristics of the head 17 and/or the media 12, and provides the resultant signals to sample interpolation logic 51, 52 . . . 58. Sample interpolation logic 51, 52 . . . 58 takes the samples of the equalized stream of digital signals and interpolates them so that, ideally, any offset between the frequency and phase of the clock signals used to write and read the data is compensated. The sample interpolation logic, for example, in an oversampling architecture will nominally take 5 input samples to generate 4 output samples of a desired sample rate, also will interpolate between the samples to provide the desired samples at the desired sampling phase.

The resultant samples for each channel are applied to a data detector 61, 62 . . . 68. One type of data detector is a maximum likelihood sequence detector which compares the incoming signals to defined particular expected signals, thus generating path metrics, and maintains a path memory of possible data sequences and selects the data sequence that has the maximum likelihood of being correct. The resultant data is output on line 71, 72 . . . 78 and the parallel data may further be combined by subsequent circuitry as needed by the multi-channel detection system of FIG. 1. Various versions of data detectors 61, 62 . . . 68 exist, including alternatives to maximum likelihood sequence detectors.

To achieve interpolating to the right time within the received digital samples involves detecting any phase error still present in the signal after sample interpolation 51, 52 . . . 58 and correcting for it.

State-space logic 80, in one embodiment, comprises multiple phase error inputs 91, 92 . . . 98, each indicating phase error of one of the read channels. The state-space logic is configured to respond to the multiple phase error inputs and weight and crosscouple the phase error indication of each phase error input with the phase error indication of each other phase error input, and to apply common gain. The weighting and crosscoupling, in one embodiment is with respect to the integral of the phase error indication of each phase error input, as will be discussed.

In one embodiment, the weight for each phase error input is related to the noise variance for the phase error input being weighted, and may be determined by weighting logic 101, 102 . . . 108. In one example, the noise variance may comprise the noise variance of the phase error indications for the channel. Alternatively, the weighting may be based on any suitable measure of noise variance for the signal sampling phase.

Feedback logic is responsive to the crosscoupling and is configured to provide a sample timing phase estimate 111, 112 . . . 118 for each read channel.

The sample timing phase estimate adjusts the sample times 51, 52 . . . 58 to tend to correct phase error in the signal.

To model the timing process, the frequency offset is expressed as a "first-order auto-regression"

$$f_{k+1} = f_k + v_k. \quad (1)$$

Here, $f_k$ denotes the frequency or frequency offset at time k and $v_k$ denotes the realization of a zero-mean additive white Gaussian noise (AWGN) process with autocorrelation function $E\{v_k v_l\} = q\delta_{kl}$. Physically, in the example of a tape system, $\{v_k\}$ includes the effects of motor-speed and tape-path induced frequency variations as well as various noise phenomena that occur during the write process.

The sampling phase at time k+1, $\theta_{k+1}$, is obtained from the sampling phase and frequency at time k as:

$$\theta_{k+1} = \theta_k + f_k. \quad (2)$$

For the multichannel case, the frequency and phase evolutions given by (1) and (2) are used for each one of the N channels.

Figure 3:
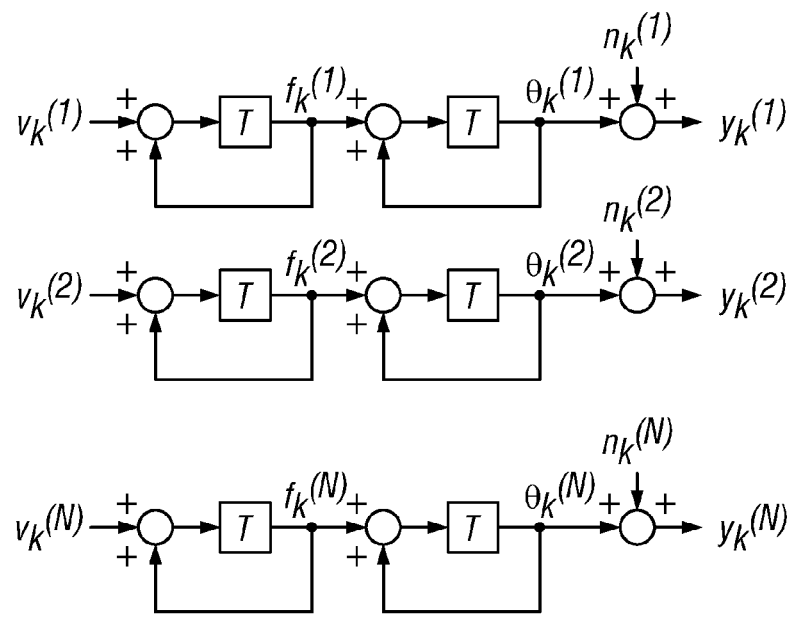
FIG. 3 is a diagrammatic illustration of the timing process for multiple read channels.

FIG. 3 comprises a representation of the timing process in an N-channel recording system. A state-space model is illustrated for the sampling phase and frequency offset of the readback signal. The inputs are the random processes $v_k^{(1)}, \ldots v_k^{(N)}$, which are in general correlated among each other.

These random processes are represented in vector form as $\underline{v}_k = [v_k^{(1)} \ldots v_k^{(N)}]'$, where the prime denotes vector transposition. The vector $\underline{v}_k$ therefore denotes a vector zero-mean Gaussian random process, with autocorrelation matrix Q, that is, $E\{\underline{v}_k \underline{v}_l'\} = Q\delta_{kl}$. At the output of the first integration steps on each channel, the frequency offset signals $f_k^{(1)}, \ldots, f_k^{(N)}$ are obtained. The second integration steps on each channel provide the sampling phase signals $\theta_k^{(1)}, \ldots \theta_k^{(N)}$. The observations of the sampling phases are perturbed by the N measurement noise processes $n_k^{(1)}, \ldots, n_k^{(N)}$. These noise processes can be represented in vector form as $\underline{n}_k = [n_k^{(1)} \ldots n_k^{(N)}]'$. The vector $\underline{n}_k$ then represents a vector zero-mean Gaussian noise process, with autocorrelation matrix denoted by R, that is $E\{\underline{n}_k \underline{n}_l'\} = R\delta_{kl}$. It may be assumed that the noise processes $n_k^{(1)}, \ldots, n_k^{(N)}$ are independent Gaussian processes. Therefore, the matrix R is a diagonal matrix with diagonal elements denoted by $R = \text{diag}(r_1, \ldots, r_N)$. Finally, the noisy observations of the sampling phases are denoted by $y_k^{(1)}, \ldots, y_k^{(N)}$.

The optimum state estimator for the state-space model of FIG. 3 is equivalent to a set of N $2^{nd}$ order PLLs having direct and crosscoupled loop gains.

Figure 4:
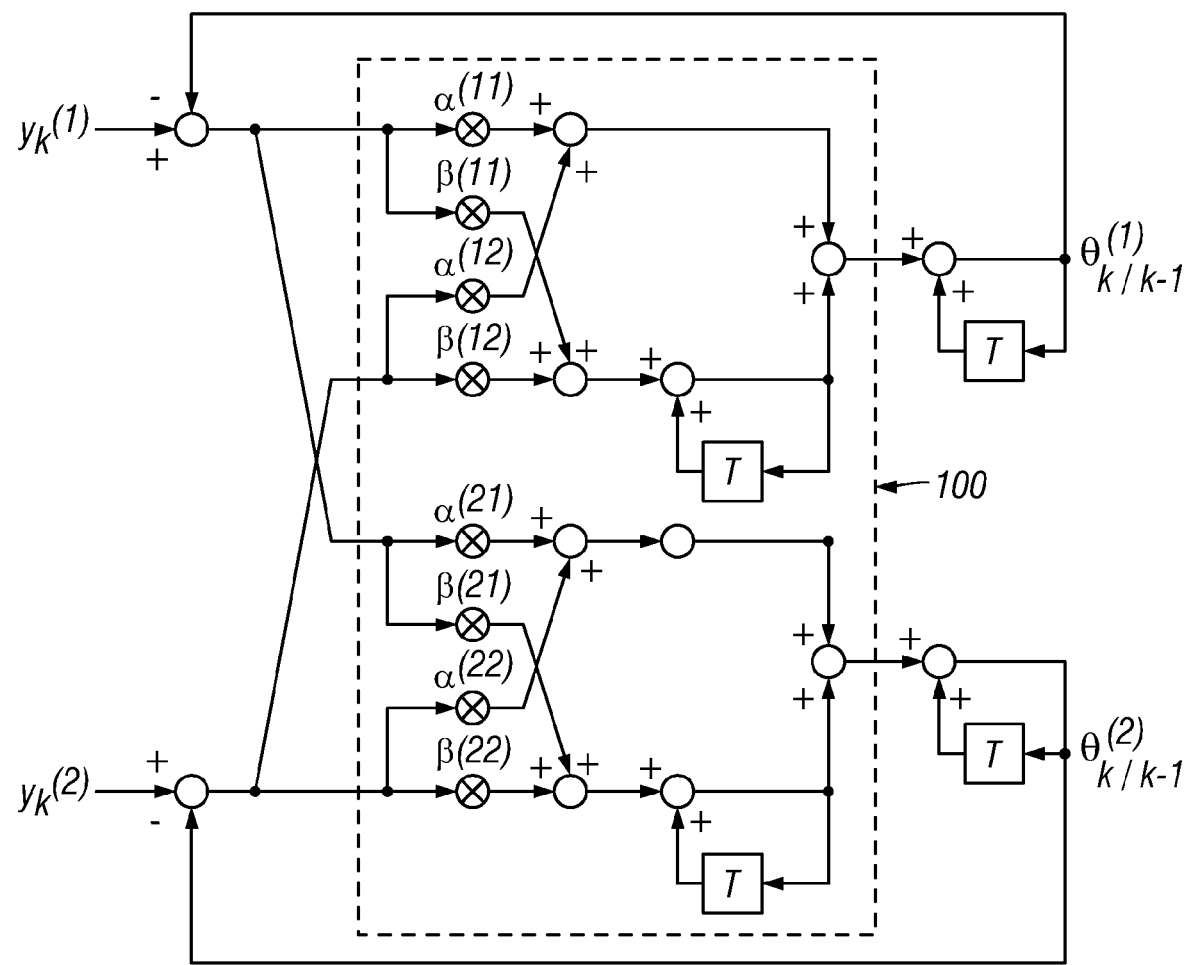
FIG. 4 is a diagrammatic illustration of a multi-channel filter for a two channel system.

FIG. 4 illustrates a multichannel PLL for a N=2 channel system in which the crosscoupling comprises both the proportional and integral terms. Input to the circuit are the noisy observations of the sampling phases $y_k^{(1)}$ and $y_k^{(2)}$. The sampling phase estimates $\theta_{k/k-1}^{(1)}$ and $\theta_{k/k-1}^{(2)}$ are subtracted from $y_k^{(1)}$ and $y_k^{(2)}$, respectively, to obtain two phase errors that are provided to a multi-input multi-output (MIMO) loop filter 100. The coefficients of this filter, also called loop coefficients, are denoted by α's and β's, with appropriate upper indices. The α loop coefficients drive the proportional terms of the MIMO loop filter whereas the β's drive the integral terms of the MIMO loop filter.

In general, the illustrated multichannel PLL structure involves a weighted sum of the phase errors (the $y_k^{(i)} - \theta_{k/k-1}^{(i)}$'s) for the proportional as well as for the integral terms of the multi-input multi-output (MIMO) loop filter. The cross-coupling gains $\alpha_k^{(ij)}, \beta_k^{(ij)}, i \neq j$, give the optimum coupling between channels.

Herein, the frequency offset variations in the individual channels are indicated as correlated. As mentioned above, this is captured by stating that the noise processes $v_k^{(1)}, v_k^{(2)}, \ldots, v_k^{(N)}$ are correlated. In accordance with the present invention, the timing process in a multichannel tape system comprises replacing the vector noise process $\underline{v}_k$ by the scalar noise process $v_k = v_k^{(1)} = \ldots = v_k^{(N)}$.

The actual loop gains are, in general, time dependent. Herein, a steady-state solution is developed, by employing the steady-state loop gains of the optimum estimator for the above state-space model and also taking into account that in an actual system the process noise $v_k$ will have a much lower power than the power of the measurement noise $n_k^{(1)}$ and $n_k^{(2)}$, which leads to the gain definitions:

$$\alpha^{(11)} = \alpha^{(21)} \cong \sqrt{2} \frac{\rho_1}{(\rho_1 + \rho_2)^{3/4}} q^{1/4} = \alpha^{(1)} \quad (3)$$

$$\alpha^{(22)} = \alpha^{(12)} \cong \sqrt{2} \frac{\rho_2}{(\rho_1 + \rho_2)^{3/4}} q^{1/4} = \alpha^{(2)}$$

$$\beta^{(11)} = \beta^{(21)} \cong \frac{\rho_1}{(\rho_1 + \rho_2)^{1/2}} q^{1/2} = \beta^{(1)}$$

$$\beta^{(22)} = \beta^{(12)} \cong \frac{\rho_2}{(\rho_1 + \rho_2)^{1/2}} q^{1/2} = \beta^{(2)}$$

with $\rho = \rho_1 + \rho_2, \rho_1 = 1/r_1$, and $\rho_2 = 1/r_2$, where α and β, with proper upper indices, comprise the proportional and integral loop coefficients, respectively; where $r_i$ represents the variance (or the power) of the measurement noise on the channel having number i, that is, this is the variance of the noise process $n_k^{(i)}$; and where q represents the power of the noise process $v_k$.

The two outputs of the MIMO loop filter are integrated to yield the sampling phase estimates $\theta_{k/k-1}^{(1)}$ and $\theta_{k/k-1}^{(2)}$.

In the general case of an N-channel system, the solution is given by:

$$\alpha^{(ij)} = \alpha^{(j)} = \sqrt{2} \frac{\rho_j}{\left(\sum_{n=1}^{N} \rho_n\right)^{3/4}} q^{1/4}, \quad (4)$$

$$\beta^{(ij)} = \beta^{(j)} = \frac{\rho_j}{\sqrt{\sum_{n=1}^{N} \rho_n}} \sqrt{q}, \quad (5)$$

$$\forall i, j = 1, \ldots, N,$$

where $\rho_j = 1/r_j$. The noise variance $r_j$ associated with channel j may be regarded as the phase jitter experienced on this channel.

Finally, defining $\zeta_j = q/r_j$, equations (4) and (5) are expressed in the form $$\alpha^{(j)} = \sqrt{2} \left( \frac{\rho_j}{\sum_{n=1}^{N} \rho_n} \right)^{3/4} \zeta_j^{1/4}, \tag{6}$$

$$\beta^{(j)} = \sqrt{2} \left( \frac{\rho_j}{\sum_{n=1}^{N} \rho_n} \right)^{1/2} \zeta_j^{1/2}. \tag{7}$$

Figure 5:
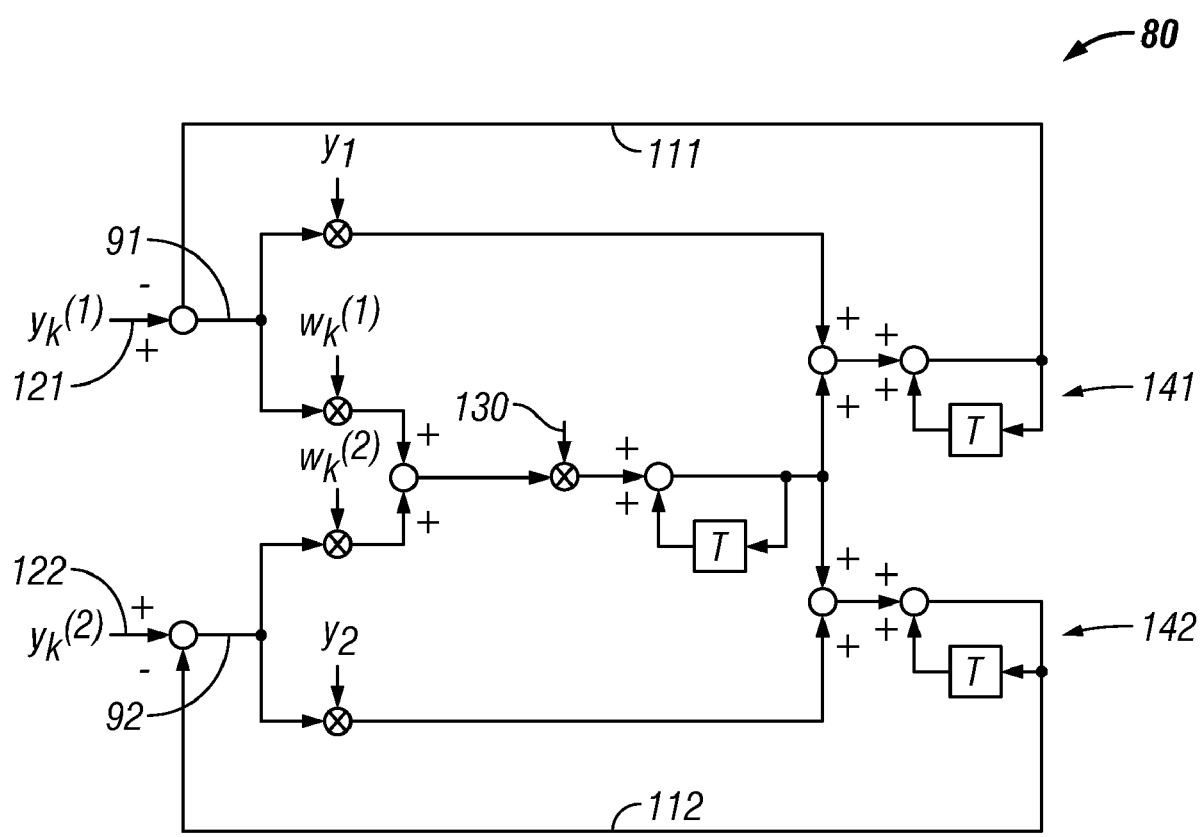
FIG. 5 is a diagrammatic illustration of a sample timing control of FIG. 2 for a two channel system.

Referring to FIG. 5, in accordance with the present invention, a multi-channel PLL embodiment of state-space logic 80 of FIG. 2 is illustrated for a N=2 channel system where the crosscoupling loop coefficients for the proportional terms are omitted, thus leaving the crosscoupling arrangement only for the loop coefficients of the integral terms. Further, in accordance with the present invention, there are as many crosscoupled loop filters as there are channels, comprising a multi-input/multi-output loop filter.

Phase error inputs 91 and 92 each indicates phase error of one of the read channels, subtracting the sample timing phase estimate 111, 112 from the phase of the input signal. The state-space logic 80 is configured to respond to the multiple phase error inputs 91, 92 and weight 101, 102 and crosscouple the phase error indication of each phase error input with the phase error indication of each other phase error input, and to apply common gain 130. The weighting and crosscoupling, in the illustrated embodiment is with respect to the integral of the phase error indication of each phase error input.

Feedback logic 141, 142 is responsive to the crosscoupling and configured to provide a sample timing phase estimate 111, 112 for each read channel.

The notation $\beta_k^{(i)} = w_k^{(i)} \sqrt{\zeta}$ is used for the loop coefficients of the integral terms. The noncrosscoupled loop coefficients for the proportional terms are denoted in this figure by $\gamma_1$ and $\gamma_2$, where the proportional parts of the loop filters are realized per channel, i.e., are not global.

In accordance with the present invention, the combination of the phase errors for the proportional terms is omitted without incurring any significant performance penalty. The combination of the phase errors is implemented for the integral terms only.

Furthermore, the set of parameters $\zeta_i = q/r_i$ are selected following a traditional, e.g., a loop time-response based, approach which initially does not take the loop couplings into account. This means that the $\zeta_i$ may be chosen to be equal, $\zeta_i = \zeta \forall i$, comprising a common gain 130. Then, coupling across channels is introduced for the integral terms only, according to equation (7), as $$\beta_k^{(i)} = w_k^{(i)} \sqrt{\zeta}, \tag{8}$$

$$w_k^{(i)} = \sqrt{\rho_k^{(i)} / \sum_{n=1}^{N} \rho_k^{(n)}} \tag{9}$$

$i = 1, \ldots, N,$ where $\rho_k^{(i)}$ is the inverse of the estimate of the measurement noise power for channel i at time k, i.e., an estimate of $1/r_i$, and N is the total number of channels.

Alternatively, the weighting coefficient is defined to omit the square-root, defining the weighting coefficient as $$w_k^{(i)} = \rho_k^{(i)} / \sum_{n=1}^{N} \rho_k^{(n)} \tag{10}$$

where $w_k^{(i)}$ is the weight for channel i at time k, and where $\rho_k^{(i)}$ is the inverse of the estimate of the noise variance of said phase error indications for channel i at time k.

There can be various ways to compute $\rho_k^{(i)}$. One is to derive it from a comparison of the phase of the input signal to the phase locked loop of the considered channel i and the signal phase of the expected bit cell, i.e., by computing the variance of the so-obtained error signal and furthermore taking the inverse of the estimated variance.

Alternatively, $\rho_k^{(i)}$ is approximated by computing the variance of the signal provided by the timing-error detector and again taking the inverse of it.

Estimates of the common gain 130 may be made by estimating $\zeta$ of equation (8) by estimating the parameters q and r, or employ a value that the designer has found appropriate by using any appropriate technique. An example is to employ the loop coefficient value (for the integral term) of a classical PLL design, where the loop coefficients are chosen by considering the time response of the PLL such as the settling time, the amount of overshoot, etc. This value of $\zeta$ may be kept fixed and the time variability taken into account through the weighting coefficients w.

Similarly, the $\gamma$ terms may be fixed: here the notation $\alpha$ is not used since the filters are not crosscoupled for the proportional terms. As mentioned above for $\zeta$, these $\gamma$ coefficients can be chosen in any manner that the designer sees fit, e.g., using classical time-response based PLL design.

Those of skill in the art will understand that changes may be made with respect to the methods discussed above, including changes to the ordering of the steps. Further, those of skill in the art will understand that differing specific component arrangements may be employed than those illustrated herein.

While the preferred embodiments of the present invention have been illustrated in detail, it should be apparent that modifications and adaptations to those embodiments may occur to one skilled in the art without departing from the scope of the present invention as set forth in the following claims.

What is claimed is:

1. For multiple read channels configured to read received signals, wherein signal clocking of said received signals are correlated, a common sample timing control, comprising: multiple phase inputs, each indicating the phase of at least one digital sample taken with respect to one of a plurality of read channels, said read channels configured to provide digital samples of said correlated signals; multiple phase error inputs, each indicating phase error of one of said read channels; logic responsive to said multiple phase error inputs configured to weight said phase error indication of each said phase error input with a weighting related to a characteristic of said weighted phase error indications for said phase error input being weighted, and crosscouple said weighted phase error indication of each said phase error input with said phase error indication of each other said phase error input, and to apply common gain to said crosscoupled weighted phase error indications; wherein said weight for each said phase error input is related to a noise variance of said phase error indications for said phase error input being weighted;

wherein said common gain is related to the ratio of the noise variance associated with frequency error variations to the noise variance associated with said phase error indications for all channels; and feedback logic responsive to said crosscoupling and configured to provide a sample timing phase estimate for each said read channel.

2. The common sample timing control of claim 1, wherein said weight and crosscoupling is with respect to an integral of said phase error indication of each said phase error input.

3. The common sample timing control of claim 1, wherein said weight for each said phase error input is determined in accordance with the formula:

$$w_k^{(i)} = \sqrt{\rho_k^{(i)} \Big/ \sum_{n=1}^{N} \rho_k^{(n)}}$$

where $w_k^{(i)}$ is the weight for channel i at time k, and where $\rho_k^{(i)}$ is the inverse of the estimate of the noise variance associated with said phase error indications for channel i at time k, and N is the total number of channels.

4. The common sample timing control of claim 1, wherein said weight for each said phase error input is determined in accordance with the formula:

$$w_k^{(i)} = \rho_k^{(i)} \Big/ \sum_{n=1}^{N} \rho_k^{(n)}$$

where $w_k^{(i)}$ is the weight for channel i at time k, and where $\rho_k^{(i)}$ is the inverse of the estimate of the noise variance of said phase error indications for channel i at time k, and N is the total number of channels.

5. The common sample timing control of claim 4, wherein said weighting and applied gain are determined in accordance with the formula:

$$\beta_k^{(i)} = w_k^{(i)} \sqrt{\zeta},$$

where $\beta_k^{(i)}$ is the gain for channel i at time k, $w_k^{(i)}$ is the weight for channel i at time k, and $\sqrt{\zeta}$ is said common gain.

6. A read detection signal clocking system for a magnetic tape drive comprising: multiple phase inputs, each indicating the phase of a sample taken with respect to one of a plurality of read channels of said magnetic tape drive, said read channels configured to provide samples of data from magnetic tape read by said magnetic tape drive; phase error logic responsive to each of said multiple phase inputs configured to determine phase error of said sample of one of said read channels and provide a phase error indication at a phase error input with respect to each of said plurality of read channels; logic responsive to said phase error inputs configured to weight said phase error indication of each said phase error input with a weighting related to a characteristic of said weighted phase error indications for said phase error input being weighted, and crosscouple said weighted phase error indication of each said phase error input with said phase error indication of each other said phase error input, and to apply common gain to said crosscoupled weighted phase error indications; wherein said weight for each said phase error input is related to a noise variance of said phase error indications for said phase error input being weighted; wherein said common gain is related to the ratio of the noise variance associated with frequency error variations to the noise variance associated with said phase error indications for all channels; and feedback logic responsive to said crosscoupling and configured to provide a sample timing phase estimate for each said read channel.

7. The read detection signal clocking system of claim 6, wherein said weight and crosscoupling is with respect to the integral of said phase error indication of each said phase error input.

8. The read detection signal clocking system of claim 6, wherein said weight for each said phase error input is determined in accordance with the formula:

$$w_k^{(i)} = \sqrt{\rho_k^{(i)} \Big/ \sum_{n=1}^{N} \rho_k^{(n)}}$$

where $w_k^{(i)}$ is the weight for channel i at time k, $\rho_k^{(i)}$ is the inverse of the estimate of the noise variance associated with said phase error indications for channel i at time k, and N is the total number of channels.

9. The read detection signal clocking system of claim 6, wherein said weight for each said phase error input is determined in accordance with the formula:

$$w_k^{(i)} = \rho_k^{(i)} \Big/ \sum_{n=1}^{N} \rho_k^{(n)}$$

where $w_k^{(i)}$ is the weight for channel i at time k, $\rho_k^{(i)}$ is the inverse of the estimate of the noise variance associated with said phase error indications for channel i at time k, and N is the total number of channels.

10. The read detection signal clocking system of claim 9, wherein said weighting and applied gain are determined in accordance with the formula:

$$\beta_k^{(i)} = w_k^{(i)} \sqrt{\zeta},$$

where $\beta_k^{(i)}$ is the gain for channel i at time k, $w_k^{(i)}$ is the weight for channel i at time k, and $\sqrt{\zeta}$ is said common gain.

11. A common state-space multi-channel digital sample timing phase control of multiple read channels for correlated signals, said signals correlated with respect to the timing of said signals, comprising: multiple phase inputs, each indicating the phase of at least one digital sample taken with respect to one of a plurality of read channels at a current state, said read channels configured to provide digital samples of said correlated signals; phase error logic responsive to each of said multiple phase inputs configured to determine phase error of said sample of one of said read channels at said current state and provide a phase error indication at a phase error input with respect to each of said plurality of read channels; logic responsive to said phase error inputs configured to weight said phase error indication of each said phase error input with a weighting related to a characteristic of said weighted phase error indications for said phase error input being weighted, and crosscouple said weighted phase error indication of each said phase error input with said phase error indication of each other said phase error input, and to apply common gain to said crosscoupled weighted phase error indications; wherein said weight for each said phase error input is related to a noise variance of said phase error indications for said phase error input being weighted; wherein said common gain is related to the ratio of the noise variance associated with frequency error variations to the noise variance associated with said phase error indications for all channels; and feedback logic responsive to said crosscoupling and configured to provide a sample timing phase estimate for the next state of each said read channel.

12. The common state-space multi-channel digital sample timing phase control of claim 11, wherein said weight and crosscoupling is with respect to the integral of said phase error indication of each said phase error input.

13. The common state-space multi-channel digital sample timing phase control of claim 11, wherein said weight for each said phase error input is determined in accordance with the formula:

$$w_k^{(i)} = \sqrt{\rho_k^{(i)} \bigg/ \sum_{n=1}^{N} \rho_k^{(n)}}$$

where $w_k^{(i)}$ is the weight for channel i at time k, $\rho_k^{(i)}$ is the inverse of the estimate of the noise variance associated with said phase error indications for channel i at time k, and N is the total number of channels.

14. The common state-space multi-channel digital sample timing phase control of claim 11, wherein said weight for each said phase error input is determined in accordance with the formula:

$$w_k^{(i)} = \rho_k^{(i)} \bigg/ \sum_{n=1}^{N} \rho_k^{(n)}$$

where $w_k^{(i)}$ is the weight for channel i at time k, $\rho_k^{(i)}$ is the inverse of the estimate of the noise variance associated with said phase error indications for channel i at time k, and N is the total number of channels.

15. The common state-space multi-channel digital sample timing phase control of claim 14, wherein said weighting and applied gain are determined in accordance with the formula:

$$\beta_k^{(i)} = w_k^{(i)} \sqrt{\zeta},$$

where $\beta_k^{(i)}$ is the gain for channel i at time k, $w_k^{(i)}$ is the weight for channel i at time k, and $\sqrt{\zeta}$ is said common gain.

16. A method for providing sample timing phase estimates for multiple read channels, said read channels configured to read signals, wherein signal clocking of said signals are correlated, comprising the steps of: providing multiple phase inputs, each indicating the phase of at least one digital sample taken with respect to one of a plurality of read channels, said read channels configured to provide digital samples of said correlated signals; providing multiple phase error inputs, each indicating phase error of one of said read channels; weighting said phase error indication of each said phase error input with a weighting related to a characteristic of said weighted phase error indications for said phase error input being weighted, and crosscoupling said weighted phase error indication of each said phase error input with said phase error indication of each other said phase error input; applying common gain to said crosscoupled weighted phase error indications; wherein said weight for each said phase error input is related to a noise variance of said phase error indications for said phase error input being weighted; wherein said common gain is related to the ratio of the noise variance associated with frequency error variations to the noise variance associated with said phase error indications for all channels; and responding to said crosscoupling and gain to provide a sample timing phase estimate for each said read channel.

17. The method of claim 16, wherein said weighting and crosscoupling is with respect to the integral of said phase error indication of each said phase error input.

18. The method of claim 16, wherein said weighting for each said phase error input is determined in accordance with the formula:

$$w_k^{(i)} = \sqrt{\rho_k^{(i)} \bigg/ \sum_{n=1}^{N} \rho_k^{(n)}}$$

where $w_k^{(i)}$ is the weight for channel i at time k, $\rho_k^{(i)}$ is the inverse of the estimate of the noise variance associated with said phase error indications for channel i at time k, and N is the total number of channels.

19. The method of claim 16, wherein said weighting for each said phase error input is determined in accordance with the formula:

$$w_k^{(i)} = \rho_k^{(i)} \bigg/ \sum_{n=1}^{N} \rho_k^{(n)}$$

where $w_k^{(i)}$ is the weight for channel i at time k, $\rho_k^{(i)}$ is the inverse of the estimate of the noise variance associated with said phase error indications for channel i at time k, and N is the total number of channels.

20. The method of claim 19, wherein said weighting and applied gain are determined in accordance with the formula:

$$\beta_k^{(i)} = w_k^{(i)} \sqrt{\zeta},$$

where $\beta_k^{(i)}$ is the gain for channel i at time k, $w_k^{(i)}$ is the weight for channel i at time k, and $\sqrt{\zeta}$ is said common gain.

* * * * *